United States Patent [19]

Feigenbaum et al.

[11] Patent Number: 5,354,205

[45] Date of Patent: Oct. 11, 1994

[54] ELECTRICAL CONNECTIONS WITH SHAPED CONTACTS

[75] Inventors: Haim Feigenbaum, Irvine; William R. Crumly, Anaheim; Christopher M. Schreiber, Newport Beach, all of Calif.

[73] Assignee: Hughes Aircraft Company, Los Angeles, Calif.

[21] Appl. No.: 51,598

[22] Filed: Apr. 23, 1993

Related U.S. Application Data

[63] Continuation of Ser. No. 750,842, Aug. 26, 1991, abandoned.

[51] Int. Cl.⁵ .............................................. H01R 9/09
[52] U.S. Cl. .................................... 439/67; 29/831; 205/78
[58] Field of Search ................... 439/67, 68, 69, 71, 439/65, 74, 75, 77, 284, 387, 482; 361/404, 405, 406; 29/830, 831, 846, 848, 849, 593; 324/158 P; 205/78; 156/150, 233, 249

[56] References Cited

U.S. PATENT DOCUMENTS

| | | | |
|---|---|---|---|
| 3,350,250 | 10/1967 | Sanz et al. | 156/150 |
| 3,778,899 | 12/1973 | Johnson | 29/831 |
| 3,881,799 | 5/1975 | Elliott et al. | 439/931 |
| 4,116,517 | 9/1978 | Selvin et al. | 339/17 F |
| 4,125,310 | 11/1978 | Reardon, II et al. | 339/92 M |
| 4,125,441 | 11/1978 | Dugan | 204/12 |
| 4,184,729 | 6/1980 | Parks et al. | 439/137 |
| 4,374,708 | 2/1983 | Dugan | 204/11 |
| 4,453,795 | 6/1984 | Moulin | 339/92 M |
| 4,466,184 | 8/1984 | Cuneo et al. | 29/830 |
| 4,564,423 | 1/1986 | Dugan | 204/281 |
| 4,584,039 | 4/1986 | Shea | 205/78 |
| 4,878,294 | 11/1989 | Dugan et al. | 204/15 |
| 4,878,990 | 11/1989 | Dugan et al. | 156/150 |
| 5,046,953 | 9/1991 | Shreeve et al. | 439/68 |
| 5,071,363 | 12/1991 | Reylek et al. | 439/290 |
| 5,105,537 | 4/1992 | Datta et al. | 29/884 |
| 5,197,184 | 3/1993 | Crumley et al. | 29/846 |

FOREIGN PATENT DOCUMENTS

WO9010320 9/1990 PCT Int'l Appl. .

OTHER PUBLICATIONS

Research Disclosure No. 319, Nov. 1990, Havant GB, XP160172, 31947: "Fixed Probe Test Adapter".
IBM Technical Disclosure; Klippel; vol. 2; No. 4, p. 7, Dec. 1959.
IBM Bulletin, Ng, vol. 21, No. 7, p. 2707, Dec. 1978.

Primary Examiner—Neil Abrams
Attorney, Agent, or Firm—Elizabeth E. Leitereg; T. Gudmestad; W. K. Denson-Low

[57] ABSTRACT

Shaped contacts (40,42) for interconnecting circuits or for use in an integrated circuit test probe are electroplated as integral parts of circuit traces (34) upon a stainless steel mandrel (10). A shaped, hardened steel indentation tool (16,18,26,28) makes indentations (24a,24b) of predetermined shape in the surface of the mandrel (10), which is provided with a pattern of dielectric, such as Teflon (12), or photoresist. Areas of the steel mandrel, including the indentations (24a,24b), are electroplated with a pattern of conductive material (34,36,38), and a dielectric substrate (32) is laminated to the conductive material. The circuit features formed by the indentations define raised contacts of a conical (18) or pyramidal (28) shape, having free ends with a small area that allows higher pressures to be applied to a surface against which the contacts are pressed. This enables the contacts to penetrate foreign materials, such as oxides, that may form on the surface of the pads (56,58), to which the contacts are to be connected to ensure a good contact without any need for wiping action. The projecting contacts can also be pressed into plated holes (82,84) in a substrate, such as a printed wiring board, to which mateable/demateable electrical connection is to be made.

6 Claims, 2 Drawing Sheets

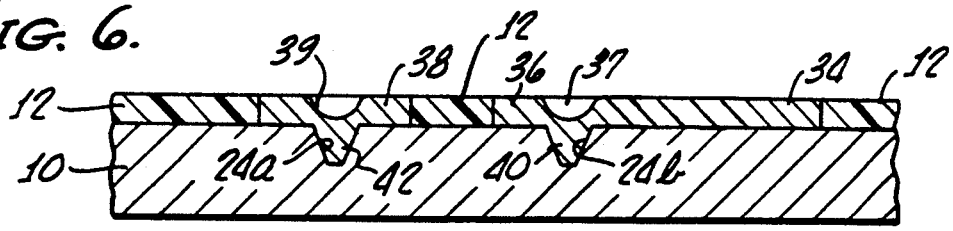
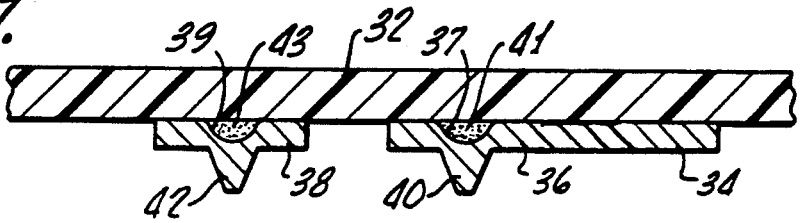
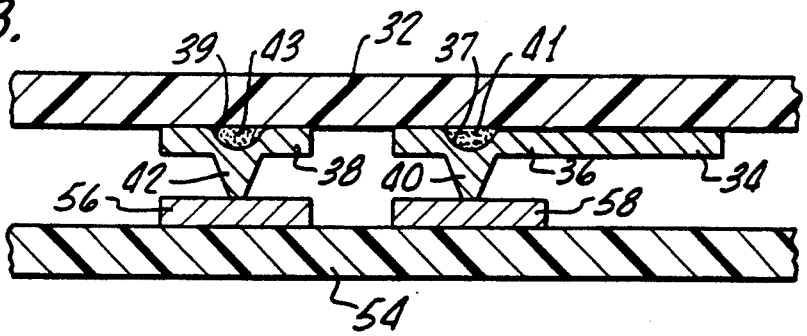
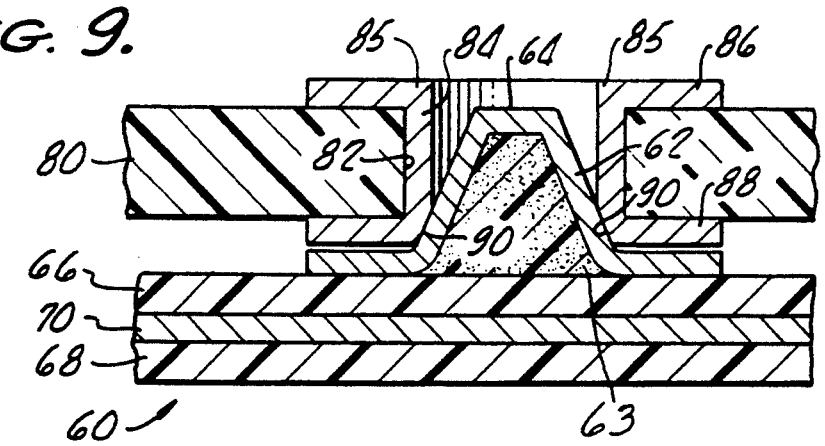

ELECTRICAL CONNECTIONS WITH SHAPED CONTACTS

This is a continuation of application Ser. No. 07/750,842, filed Aug. 26, 1991, now abandoned.

BACKGROUND OF THE INVENTION

1. Field of the Invention

The present invention relates to manufacture of electrical circuitry and more particularly concerns electrical contacts of improved efficiency and configuration.

2. Description of Related Art

Both flexible and rigid circuits including integrated circuits are connected to similar circuits and other components, or to testing devices, by means of various types of connecting devices. Flat, flexible printed circuit connecting cables warrant use of similarly configured connecting devices and have been developed to a point where connection between one such printed circuit cable and another circuit is made by providing a plurality of projecting metallic interconnection features ("dots") that may be pressed against either similar features or mating metallic connecting pads on the other circuit component or components. Flexible circuit terminations or connecting wafers of this type are described in U.S. Pat. No. 4,125,310 to Patrick A. Reardon, II, deceased et al U.S. Pat. No. 4,116,517 to Selvin et al, and U.S. Pat. No. 4,453,795 to Moulin. The connectors of these patents embody a substrate having traces chemically milled thereon with a plurality of metallic raised features later formed to project from the plane of the circuit connectors. Thus, when two such connectors are placed face to face with the raised features of one in registration and contact with the other, the planes of the etched electrical circuits are suitably spaced from one another because of the projection of the features. The two circuits may be physically clamped together to press the features against one another, thereby making firm and intimate electrical contact between the two circuits.

These termination arrangements are effective and reliable in operation but difficult, costly and time consuming to manufacture. Major problems in manufacture of such connectors derive from the fact that the projecting contact buttons must be fabricated separately from (either before or after) the fabrication of the circuitry itself. This creates difficult registration problems. For example, after drilling appropriate interconnection and tooling holes through a copper clad dielectric core or substrate and plating through some of the holes to interconnect circuitry on the two sides of the core, the core is placed between the circuit artwork (optical masks) positioned on either side of the core and the holes in the artwork or datum points are then manually aligned with the predrilled holes in the core. Where dozens of parts may be made on a single panel that is 12"×18", and alignment tolerances are measured within a few microns, registration of all or even most holes in all of the parts is exceedingly difficult, time consuming and often times not possible because of changes in dimensions of the panels following some of the processing operations. After registration of the artwork, the substantially planar circuitry is chemically milled or etched on the copper surfaces (the panel may often be covered with a coating of copper on both sides for a double sided panel). The etching process involves application of photoresist, masking the resist, exposing the resist, developing the resist, then etching through the portions of the copper not protected by the resist so that upon stripping of the remaining resist, the circuit pattern of the copper conductors remains.

Where raised interconnection features are employed, it is then necessary to plate the projecting contact features on pads formed in the circuitry which has been previously etched. These features must be precisely registered with the selected pads and with the datum of the panel. However, the panels have been previously processed to form the circuit traces so that further stresses occurring in such processing effect changes in dimension (usually, but not always, shrinkage). The changing dimensions cause severe registration problems. To manufacture the projecting contact features (sometimes called "dots"), the etched circuit is coated with a resist. Again, the appropriate artwork for defining the desired hole in the resist at the dot location must be carefully registered, which is now an even more difficult task.

In some cases, the projecting interconnection features or dots may be formed first, before the remainder of the etched circuit is formed. But, in any event, the feature must be formed separately, at a different time than the time of forming the etched circuitry, and thus the registration problems are created or exacerbated.

In such circuits, where a connection must be made from circuitry on one side of the core to circuitry on the other side of the core, holes are drilled and throughhole plated, requiring still further steps and creating other registration problems that increase cost and time of manufacture.

Conventional etched circuit processes, in general, have a number of disadvantages. Dimensional precision is difficult to achieve. The use of various etching, stripping and cleaning fluids requires special handling of hazardous chemicals. Techniques for disposal of the resulting effluents are complex and expensive, and subject to strict government controls. Etched circuit processing has a relatively low yield, greatly increasing the cost of the processing, which inherently involves a large number of costly processing steps.

Regardless of the manner in which the connections are made, it is frequently necessary to impart a type of wiping or abrasive action when one circuit is actually being connected to another so as to ensure a good electrical contact. This is so because circuits pads of many different types of materials are subject to accumulation of foreign poorly conductive materials on the contact surfaces. Thus, tin, silver, aluminum and copper contact elements, among others, will experience relatively rapid oxidation, so as to form oxide layers which tend to degrade electrical contacts made at such oxidized surface.

For this reason, gold to gold contacts are employed to eliminate the oxidation problems and improve the making of electrical contacts between several circuits. The need to use expensive gold coatings on the contacts can be avoided by use of an abrasive or wiping action when the contact is made. The wiping action physically abrades the foreign surface or oxide coating at the time of making the contact.

Gold coatings are expensive and may often require an additional processing step. The need for a wiping action can increase the cost and complexity of connecting equipment. Moreover, wiping action to ensure good contact may not be available with many different types of test probes, which are used for testing integrated circuits on a wafer before the circuits are separated from one another. In the testing of such circuits, contacts of the test probe are moved so as to touch contact pads on the integrated circuit under test, and often only a pressure action is available without any type of wiping. For this reason, it frequently happens that a desired electrical connection between a test probe contact and a contact pad on the circuit under test is not adequately made, or is not made at all, thereby degrading test results.

Accordingly, it is an object of the present invention to provide for connection between electrical circuits while avoiding or minimizing above mentioned problems.

SUMMARY OF THE INVENTION

In carrying out principles of the present invention in accordance with a preferred embodiment thereof electrical connections are made by means of uniquely shaped projecting contacts formed on circuit traces of the circuit or test probe to be connected to another circuit. In a first set of embodiments, the shaped contacts are effectively pointed at their free ends, being of either conical, truncated conical, pyramidal or truncated pyramidal shape, so as to provide small area contact ends that will concentrate the contact forces and more readily penetrate surface layers of foreign materials and make contact to pads on the mating circuit. The contacts also lend themselves to an automatic wiping action, without any lateral motion, when making contact with another circuit at a plated though hole, by entering the plated hole in the other circuit so that sharp edges of a pyramidal shaped contact or tapered sides of a conical shaped contact can wedge themselves into the plated hole as the two circuits are pressed together.

According to another feature of the invention, shaped contacts are provided with a semi-spherical end so that when a sliding or lateral wiping action is employed to ensure good contact, a slight misalignment of the contacts may be tolerated without causing a sharp edge of the contact to dig into and damage the pad against which the contact is pressed.

BRIEF DESCRIPTION OF THE DRAWINGS

In the accompanying drawings:

FIG. 6 illustrates a further step in the manufacture of the shaped contact bearing circuit;

FIG. 7 shows a circuit including a substrate having conductive traces and shaped connective features thereon;

FIG. 8 illustrates the connection of a circuit with the shaped connections to another circuit; and FIG. 9 shows another mode of use of the shaped connective features for making a connection with a second circuit.

DETAILED DESCRIPTION OF THE PREFERRED EMBODIMENT

The methods and apparatus described herein enable the manufacture of electrical circuits with uniquely shaped contact features, wherein the circuits lie in a single plane, with the contact features projecting from such plane. The projecting features and circuitry are all formed by additive processes, such as electrolytic plating, electroless plating, electrophoretic or electrostatic coating or other forms of electroforming or electrodeposition of conductive material. No etching is formed in the manufacture of the circuit, thereby making it an environmentally safe process.

Briefly, the circuit is manufactured by using a mandrel having a working surface that is formed of a material that can have conductive circuitry electroformed thereon and which has a pattern of material that is resistant to the electroforming process. The mandrel is formed with a depression of a predetermined configuration that will produce an electroformed projecting shaped contact having the configuration of the depression.

Figure 1:
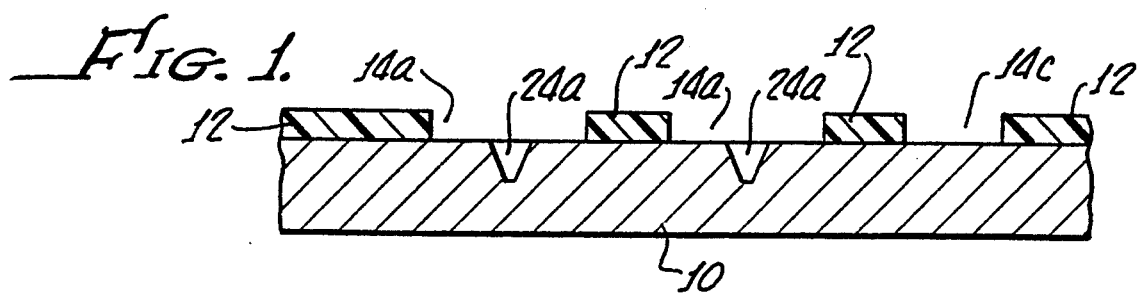
FIG. 1 illustrates a preliminary step in the manufacture of a circuit having shaped contacts.

As illustrated in the cross section of the fragmentary view of FIG. 1, a mandrel 10 is formed of a sheet of metal, such as a stainless steel having a thickness on the order of 1/16 of an inch for example, and having dimensions suitable for making one or a plurality of parts. In one method for fabricating a mandrel with raised features (e.g. a depression) the stainless steel mandrel 10 is initially provided with a non-conductive coating, such as Teflon 12, which is then ablated, as shown in FIG. 1, as by use of a laser, for example, to form a positive pattern of grooves, such as grooves 14a, 14b and 14c in the Teflon. The pattern of grooves exposes the conductive surface of the stainless steel mandrel and leaves a negative pattern of the electrically non-conductive Teflon on the mandrel working surface.

The method described to this point, and certain other steps to be described hereinafter, are similar to methods described in a co-pending application for Three-Dimensional Electroformed Circuitry, invented by William R. Crumly, Christopher M. Schreiber and Haim Feigenbaum, Ser. No. 07/580,758, filed Sep. 11, 1990, now U.S. Pat. No. 5,197,184. The disclosure of such co-pending application, which is assigned to the assignee of the present application, is incorporated herein by this reference as though fully set forth.

Figure 2:
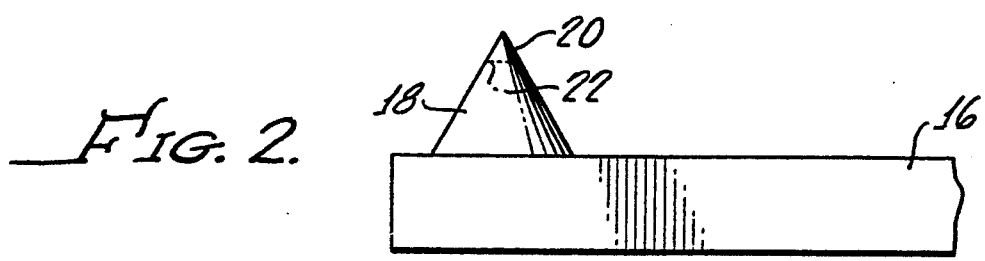
FIGS. 2 through 5 illustrate side and plan views, respectively, of two differently shaped tools for use in forming depressions in a circuit manufacturing mandrel.
Figure 3:
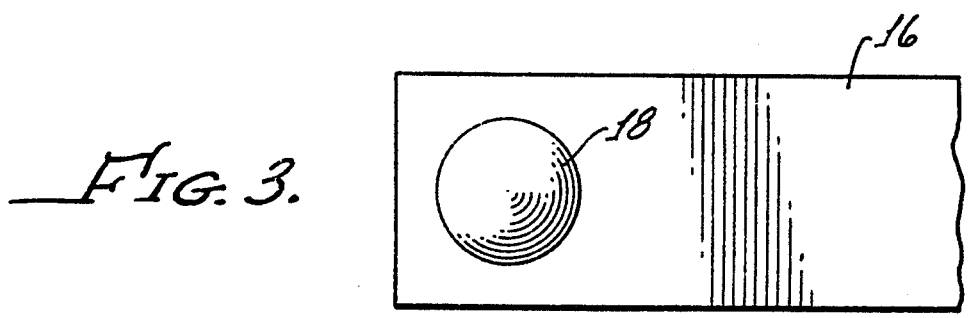
Figure 4:
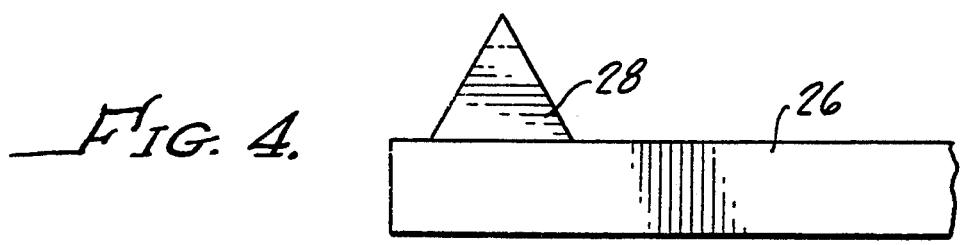
Figure 5:
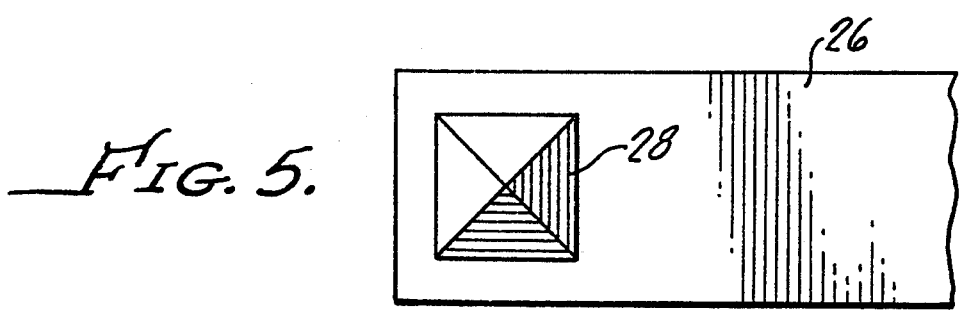

In the identified co-pending application, one or more depressions 24a,24b are formed in the surface of the stainless steel mandrel 10 at areas, such as 14a and 14b, by means of photolithographic processes, employing a suitable photoresist coating, which is masked, exposed and developed, and then subjecting the mandrel to an etching bath to form the depression on the working surface of the mandrel. However, control of the shape of the depression is a significant feature of the present invention. Adequate control of this shape is not possible with the prior etching process. Therefore, in order to more precisely control the shape of the depressions 24a and 24b to any one of a number of different predetermined shapes, there is used an indentation tool, such as that shown for example in FIGS. 2 and 3. This tool includes a hardened steel base 16 and a shaped tapered projection 18 that is fixedly secured by any suitable means to the base 16. The projection 18 may be a pin fixed to the base that has been ground or otherwise machined to provide the illustrated shape. For the indentation tool shown in FIGS. 2 and 3 the shape of the indenting feature 18 of the tool is a cone, having a predetermined cone angle. Tool 16 is used to form the indentations 24a, 24b in the surface of the mandrel 10, as, for example, by mounting the tool on a carriage (not shown) supported over the mandrel for precision motion in orthogonal X and Y directions. The tool and its indentation feature, which is pointing down toward the mandrel, are moved to a predetermined position and then the hardened tool and its tapered indentation feature are pressed against the mandrel to form the indentation. The tool is then raised and precisely moved to a second location, and a second indentation is formed. This procedure is repeated. Thus, a group of indentations are formed on the mandrel in any given pattern, with the location of the several indentations precisely positioned according to the degree of precision available from the X,Y drive of the tool carrying carriage.

For an alternate tapered contact configuration, the tip 20 of the projecting feature 18 may be removed, as by grinding, clipping or the like, to provide a shape of projection feature having a tapered body and a very small area flat surface on its free end. The small area, substantially a flat free end, is illustrated by the dotted line in FIG. 2.

For use of the tapered contacts in connecting two integrated circuits to one another, the tapered indentations (the tapered indentations 24a and 24b of the mandrel have the same dimensions as the tapered projection 18 on the tool) may have a base of about 10 mils in diameter, a tip area of about 5 mils diameter, and the height of the projection 18 may be 8 mils. Where the projecting features are used as contacts on a test probe they may be made considerably smaller so that the base of the projection may be in the order of 2 to 3 mils, with the top area having a diameter of about 1.0 mils. In such a test probe fixture the height of the tapered projecting contacts may be ½ to 4 mils.

In an alternate tooling configuration for making an indentation of a slightly varied shape (FIGS. 4 and 5), the hardened tool steel base plate 26 is formed with a rigid tapered pyramidal projection 28 fixedly secured thereto. While the drawing shows a pyramid with a base that is square, other shapes may be used (such as diamond). A different number of sides (such as three, forming a tetrahedron) may be used. It will be seen that a group of the possible projection configurations described above and shown in the drawings have a shaped defined by revolution of a line about an axis that intersects the line. This provides the sharp pointed cone and pyramid projections, among other projection shapes, that are shown in FIGS. 2, 3, 4, and 5. Just as with the conical tapered projection feature 18, the pyramidal projection, if deemed necessary or desirable, may have a portion of its tip removed to provide a small area tip at its free end.

After forming a number of depressions 24a, 24b, etc. in predetermined areas of the stainless steel mandrel 10 that are not covered by Teflon 12 with the hardened steel indentation, the mandrel with its depressions, is subjected to an electroforming processing such as electrolytic plating to electrodeposit a layer of copper or other suitable conductive material over the entire exposed conductive surface of the mandrel. Depending on the thickness of the electroplated layer of conductive material 34,36 and 38 of copper or the like, a depression, such as depressions 37,39 (FIG. 6) will be formed in the pads 36,38, which create a tapered projection feature that lines the depression and is effectively hollow to some extent. For small projection features, subsequent lamination steps will fill the feature with dielectric material. For larger features these depressions may be filled with an epoxy 41,43 (FIG. 7) that hardens to a solid to strengthen the resulting projecting contact. Steps in the processing of the circuit that follow are the same as those described in the aforementioned co-pending application for Three-Dimensional Electroformed Circuitry. These following steps include the lamination of a dielectric substrate 32 to the subassembly of mandrel, Teflon and circuit traces of FIG. 6. Thereafter the assembly of substrate 32, together with the circuit traces 34 and pads 36,38 with their tapered projecting contacts 40,42, are removed as a unit from the mandrel 10 to result in the assembly illustrated in FIG. 7. An insulating coverlay may then be deposited over the exposed circuitry, leaving tips of the projections free of the insulation.

FIG. 8 illustrates application of the described shaped contacts for use in a test probe. FIG. 8 shows a part of a test probe as including the dielectric substrate 32 with its pattern of circuit traces illustrated by trace 34, and its pattern of pointed connecting contacts illustrated in FIG. 8 by contacts 40 and 42. An integrated circuit wafer 54, having a plurality of test contact pads 56,58, is brought into close proximity to the test probe, with the contact pads 56,58 of the wafer 54 in registration with the corresponding pattern of tapered pointed contact features 40,42. The test probe is then pressed against the wafer to cause the pointed test probe contacts 40,42 to penetrate at their pointed free ends any surface contamination or oxide layer on the surface of contacts 54,56 to form a good electrical contact between the test probe and the integrated circuit wafer 54. No wiping action is required in this arrangement, since the pointed, small area ends of the conical or pyramidal shaped contacts 40,42 readily provide a sufficiently high unit pressure at the surface of contact test pads 56,58 to penetrate any oxide or other foreign layer. If deemed necessary or desirable, hard gold coated over nickel or other coatings of superior wear resistance and similar oxidation resistance may be employed to coat the probe contacts 41,41.

The arrangement for connecting the tapered pointed contacts of the test probe with an integrated circuit wafer, as described in connection with FIG. 8, may also be used for making permanent or semi-permanent connections between two different circuits, which are then physically clamped, bonded, or otherwise held together to retain the electrical interconnection between the raised contacts and contact pads. However, the tapered contact configuration readily lends itself to an alternate form of permanent or semi-permanent repairable connection between two circuits, as illustrated in FIG. 9. Thus, a first circuit 60, formed as described in connection with FIGS. 1 through 7 above, is provided as including a pointed tapered projecting hollow contact 62, filled with an epoxy 63 and having a small area flat upper end 64. The projecting contact and its pad are formed on a substrate having a first dielectric layer 66 and a second dielectric layer 68 between which is sandwiched an electrical ground layer 70. For this application, the projecting contacts may be larger, as mentioned above, then the projecting contacts of a test probe.

A circuit to which the circuit 60 of FIG. 9 is to be connected includes a dielectric substrate 80 bearing circuitry (not shown) and having a hole 82 which is through-hole plated with a conductive material, such as a metal 84, wherein the metal plating of the through hole includes flanges 86,88 extending radially outwardly from the hole on both sides of the substrate 80. Initially, the hole plating has relatively sharp corners 85 at the inner end of flanges 86. In making this connection between the circuits on substrate 80 and circuit 60, the one or more tapered and pointed projecting connectors, such as that illustrated at 62, are formed in a pattern that is identical to the pattern of holes 82. With the projecting connecting features in registration with the holes, the two circuits are pressed against one another to cause the tapered projections to partly enter the holes. As the projection features enter the holes their tapered surfaces wedge the projection features into the holes, slightly deforming the hole edges or corners, as indicated at 90, to perform the equivalent of a wiping action that ensures a good solid electrical connecting contact despite any non-conductive oxidation coating that may have formed on the hole plating. Where the tapered projection is of pyramidal shape, having relatively sharp edges, such sharp edges even further facilitate and enhance the wedging action and the penetration of foreign surface layers of poorly conductive material, such as oxides. This wiping and wedging action causes penetration of oxide coatings of both the hole plating and the projecting contact surfaces. The two circuits may be either clamped together or held together in any other suitable manner, such as, for example, by use of pressure sensitive adhesive.

The angle of the sides of the pyramidal or conical projection may be varied so as to control the nature of the wedging action and to obtain an optimum wiping action as the tapered projecting connective features penetrate the holes. Although a through hole is illustrated in FIG. 9, it will be readily appreciated that for those circuits embodying thicker substrates or for multiple layers of circuit boards stacked to one another, the hole into which the tapered contact is pressed need not be a through hole.

There have been described circuits having fixed shaped contacts where the shapes are uniquely adapted for improving electrical contact without requiring any wiping action for good electrical connections. The contacts may be made in any suitable predetermined shape by use of an appropriately shaped indentation tool. Useful shapes include conical and pyramidal shapes, including truncated versions of these, and also spherical or near spherical shapes or bullet shapes that permit a conventional wiping action while tolerating some misalignment of contacts.

What is claimed is:

1. A method of testing an integrated circuit having a pattern of contact pads, said method comprising the steps of:
    providing an indentation tool having a base and a shaped tapered projection, said projection having a projection shape defined by revolution of a line about an axis that intersects the line,
    employing said indentation tool to form in a mandrel depressions having said projection shape,
    forming on said mandrel a test probe circuit having a plurality of circuit traces and a plurality of connector pads, at least a group of said connector pads having integral shaped contact features that have said projection shape, said shaped contact features being in a pattern that matches said pattern of contact pads on said integrated circuit, said step of forming comprising the steps of:
    electrodepositing a single layer of conductive material on said mandrel, said single layer forming circuitry that comprises said plurality of circuit traces, said plurality of connector pads and said shaped contact features on said mandrel, such that said shaped contact features are integrally electroformed with their respective connector pads and circuit traces,
    laminating a dielectric substrate over said single layer of circuitry, and
    removing said laminated circuitry and substrate from said mandrel to form said test probe with said shaped contact features projecting therefrom, and
    pressing said shaped contact features of said test probe circuit against said integrated circuit pads, wherein at least one of said integrated circuit contact pads has a surface bearing a foreign material of poor electrical conductivity such that said shaped contact features penetrate said foreign material to complete a temporary electrical connection with said integrated circuit contact pads until said testing of said integrated circuit is completed.

2. The method of claim 1 wherein each of said shaped contact features has a conical shape.

3. The method of claim 1 wherein each of said shaped contact features has a pyramidal shape.

4. An electrical test probe comprising:
    a flexible dielectric substrate, and
    a plurality of circuit traces on the substrate having probe contact pads which are adapted for making electrical connection to circuit contact pads of a circuit element to be tested, each of said probe contact pads having a projection feature that has a projection shape defined by revolution of a line about an axis that intersects the line such that each probe contact pad comprises a raised projection feature projection from said probe contact pad that terminates in a free end of reduced area, said free end of reduced area of each said projection feature being configured and arranged for penetrating a layer of poor conductivity foreign material on a surface of said circuit contact pads upon application of pressure thereto such that a temporary electrical connection is achievable,
    wherein said projection features, circuit traces and probe contact pads consist essentially of a single electrodespositable integral conductive layer, said projection shape of said projection feature being the shape of a depression in a mandrel such that said projection features have consistently uniform shape and size and said single electrodepositable conductive layer eliminates interfaces or joints between said circuit traces, probe contact pads and projection features.

5. The test probe of claim 4 wherein said projection shape is conical and tapers to a point at its free end.

6. The test probe of claim 4 wherein said projection shape is pyramidal.

* * * * *